United States Patent [19]
Weiss et al.

[11] Patent Number: 4,772,353
[45] Date of Patent: Sep. 20, 1988

[54] APPARATUS FOR CUTTING PHOTORESIST WEBS INTO PHOTORESIST SHEETS OF DEFINED SIZE AND EXACT, FOLD-FREE LAMINATION OF THESE WITH FLEXIBLE AND RIGID BASES

[75] Inventors: Gregor Weiss, Mutterstadt; Klaus Filsinger, Bruehl; Rainer Eckelmann, Hassloch; Ronald Giese, Laumersheim; Thomas Koenig, Ludwigshafen; Albrecht Eckle, Beindersheim, all of Fed. Rep. of Germany

[73] Assignee: BASF Aktiengesellschaft, Ludwigshafen, Fed. Rep. of Germany

[21] Appl. No.: 899,606

[22] Filed: Aug. 25, 1986

[30] Foreign Application Priority Data

Sep. 2, 1985 [DE] Fed. Rep. of Germany ....... 3531271

[51] Int. Cl.⁴ ..................... B32B 31/18; B32B 31/20
[52] U.S. Cl. .................... 156/521; 156/522; 156/555
[58] Field of Search .......... 156/521, 522, 555

[56] References Cited

U.S. PATENT DOCUMENTS

| | | | |
|---|---|---|---|
| 4,025,380 | 5/1977 | Bernardo | 156/522 |
| 4,585,509 | 4/1986 | Obayashi | 156/522 |
| 4,659,419 | 4/1987 | Miyake | 156/555 |

*Primary Examiner*—Caleb Weston
*Attorney, Agent, or Firm*—Keil & Weinkauf

[57] ABSTRACT

An apparatus for cutting photoresist webs into photoresist sheets of defined size and exact, fold-free lamination of the photoresist sheets with flexible and rigid bases, for example blank circuit boards, consisting of a copper-plated base, is integrated into a movable assembly of a laminator so that cutting and lamination are effected without interrupting the lamination process.

3 Claims, 1 Drawing Sheet

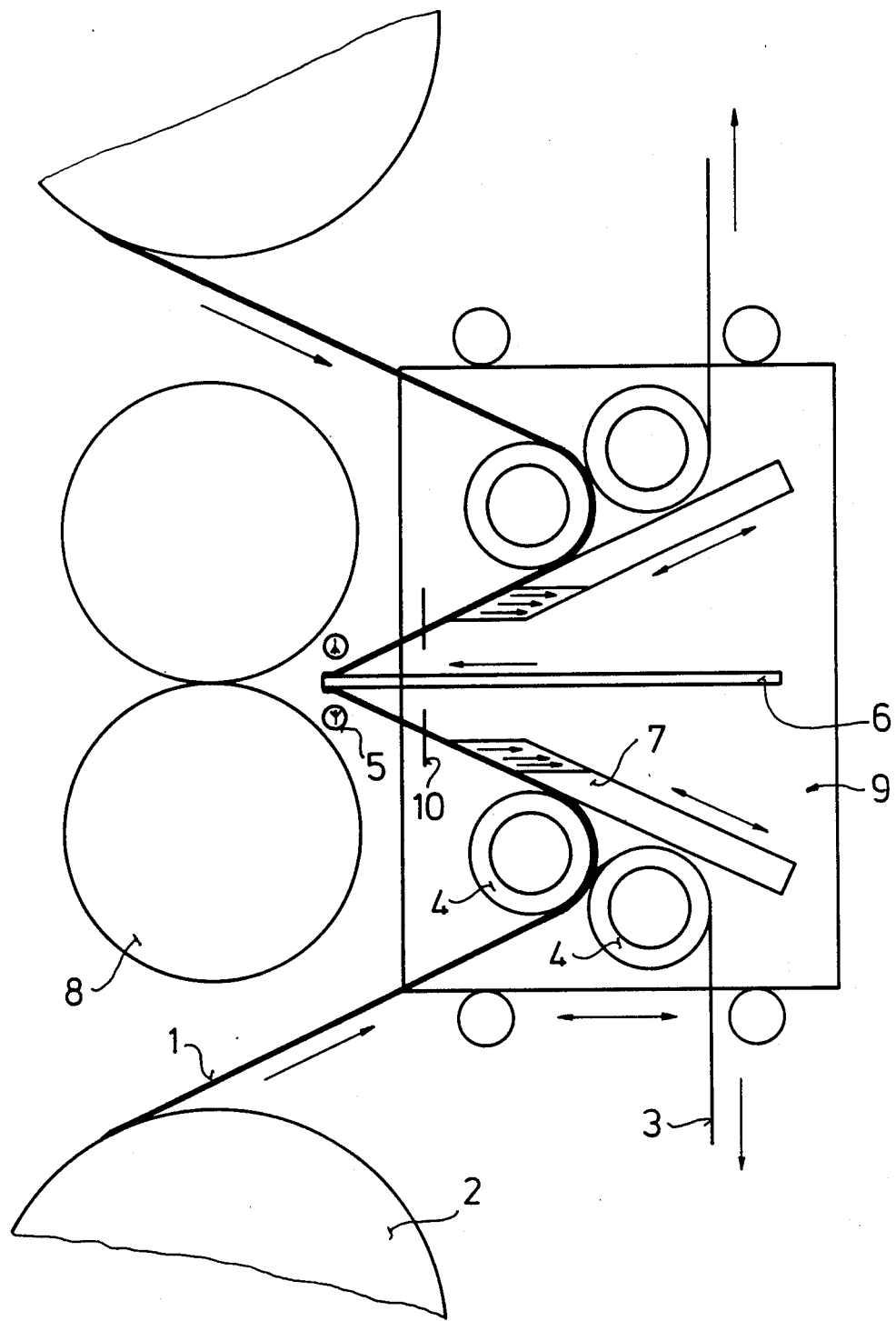

APPARATUS FOR CUTTING PHOTORESIST WEBS INTO PHOTORESIST SHEETS OF DEFINED SIZE AND EXACT, FOLD-FREE LAMINATION OF THESE WITH FLEXIBLE AND RIGID BASES

The present invention relates to an apparatus for cutting photoresist webs into photoresist sheets of defined size and exact, fold-free lamination of the photoresist sheets with flexible and rigid bases, for example blank circuit boards, consisting of copper-plated base material.

The lamination of blank circuit boards with photoresists forms part of the process for the production of printed circuit boards.

It is known that individual blank circuit boards consisting of a base, generally a copper-plated base, can be laminated by being fed, board by board, between the photoresist webs unrolled in the laminator and pressed together by the heated laminating rollers. The laminated blank circuit boards are then separated manually with a scalpel on emerging from the laminator, ie. the photoresist webs which have been applied onto both sides of the blank circuit boards, and which emerge from the laminator as a continuous belt, are cut, and the edges projecting from the blank circuit board are trimmed.

This method of cutting both manually and mechanically has the disadvantage that photoresist material which projects slightly separates from the blank circuit boards and results in defects during manufacturing processes.

This disadvantage can be avoided if the photoresist is cut 10 mm smaller than the blank circuit board all around, ie. a peripheral strip of about 10 mm of copper-plated base remains uncovered by the photoresist on the blank circuit board. At the same time, this cutting technique improves the uniformity of deposition in the subsequent manufacturing process of electroplating as a result of this exposed peripheral copper strip, which is known as a plating frame.

A number of apparatuses are available today for this cutting technique; however, these apparatuses have decisive disadvantages, for example production of folds in the photoresist and stopping of the lamination process twice, during adhesion of the photoresist and during the cutting processes.

Since transfer of the photoresist is carried out ideally at 110° C. under a relative nip pressure of from 150 to 320 kp over the entire width of the laminating rollers of, for example, 746 mm by liquefying the photoresist, it is clear that this stopping under heat and pressure is extremely problematic and requires a great deal of effort to prevent possible undesirable consequences such as stripe formation and bubble formation. Consequently, the blank circuit boards are heated directly at about 110° C. via two pairs of rollers, while the laminating rollers are heated only to 70°-90° C. These measures constitute expensive compromises in comparison with the prior art described below for transferring photoresists, even in view of the laminating results. In the prior art, both photoresist sheets are transferred simultaneously in one continuous defined movement, between only two silicone rubber-coated steel rollers at 110° C. and under a relative nip pressure of 150-320 kp/cm over the entire width of the laminating rollers of, for example, 746 mm.

It is an object of the present invention to carry out cutting of the photoresist webs to the correct format in such a way that the laminating process itself can be carried out with the ideal prior art laminating parameters, without interruption, ie. without expensive compromises, to give ideal laminating results, and the transfer of the photoresist onto the blank circuit board takes place without the production of folds or bubbles.

We have found that this object is achieved, according to the invention, if the apparatus for cutting and laminating is integrated into a movable assembly of a laminator so that cutting and laminating can be effected without interrupting the lamination process.

The novel apparatus is especially advantageous for thin blank circuit boards.

This means that, in order to cut the running photoresist webs being unrolled, the entire apparatus with the cutting blades is coupled mechanically to the laminator, via magnetic coupling, and is moved.

An embodiment of the invention with the essential inventive features is shown in the drawing and described below. The drawing shows a section through the apparatus and the laminating rollers of the associated laminator.

The photoresist webs 1 are unrolled from the two photoresist rolls 2, the protective films 3 are peeled of and rolled up separately and the said photoresist webs are then fed through the transport rollers 4 to the novel apparatus, which are driven during the process. The transport rollers are provided with an idle mode so that the photoresist webs can easily be introduced manually, for example after insertion of new photoresist rolls. The two photoresist webs are fed to a defined position at the blast tubes 5. After start-up of the laminator, the blank circuit boards 6 are fed for lamination board by board, with a predetermined spacing between the individual boards. At the same time, the photoresist webs are sucked over their entire width against the front edge of the vacuum strips 7 by means of reduced pressure. The photoresist webs which project as far as the blast tubes are guided over their entire width by means of air flowing out of the blast tube. When the first blank circuit board introduced has reached an appropriate position by means of a feed apparatus which is not shown, the transport rollers are driven and the vacuum strips together with the photoresist webs adhering to the front edge of these strips are moved toward the laminating rollers 8 until the photoresist webs together with the blank circuit board are gripped by the driven laminating rollers, with simultaneous feed of the photoresist webs by the transport rollers, and the laminating process thus begins. At the same time as the photoresist webs are gripped by the laminating rollers, the vacuum strips are returned to the starting position. When the rear (following) edge of the blank circuit board reaches an appropriate position, the entire apparatus mounted on a movable assembly 9 is connected mechanically to the laminator drive via a magnetic coupling, and is moved toward the laminating rollers. At the same time, the two cutting blades 10 move, and the two photoresist webs are cut parallel without it being necessary to stop the laminating process during the cutting operation. The processes described are then repeated continuously and automatically for every subsequent blank circuit board. All movements are controlled optoelectronically.

The advantages obtained with the novel apparatus are, in particular, the possibility of using a lamination technique without having to interrupt the laminating process, coupled with comparatively low construction costs compared with conventional apparatuses. Furthermore, very good results are obtained in transferring photoresist webs onto especially thin blank circuit boards, ie. blank circuit boards up to a thickness of only 0.1 mm. Thus, fold-free transfer of photoresist webs onto these thin blank circuit boards can be achieved by means of the novel apparatus.

We claim:

1. Apparatus for cutting photoresist webs into photoresist sheets of defined size and for bringing about, with the aid of heated laminating rollers, exact, fold-free lamination of the photoresist sheets onto flexible and rigid bases, for example blank circuit boards, consisting of a copper-plated base material, wherein said apparatus comprises an integrated assembly which is movable, as a whole, in the direction toward and away from the laminating rollers, and which carries means, including transport rollers, for transporting the webs incoming to said assembly towards said bases substantially free of tension, and also carries means for cutting said webs, so that cutting and laminating can be effected without interrupting the laminating process.

2. Apparatus as claimed in claim 1, wherein said cutting means is in the form of a pair of cutting blades movably mounted on said integrated assembly.

3. Apparatus for cutting photoresist webs into photoresist sheets of defined size and for bringing about, with the aid of heated laminating rollers, exact, fold-free lamination of the photoresist sheets onto bases, such as blank circuit boards of a copper-plated base material, wherein said apparatus is dimensioned for the lamination of photoresist sheets onto bases having a thickness in the order of 0.1 mm and said apparatus comprises an integrated assembly which is movable, as a whole, in the direction toward and away from the laminating rollers, and which carries means, including transport rollers, for transporting the webs incoming to said assembly towards said bases substantially free of tension, and also carries means for cutting said webs, so that cutting and laminating can be effected without interrupting the laminating process.

* * * * *